United States Patent [19]
Huang

[11] Patent Number: 6,098,145
[45] Date of Patent: Aug. 1, 2000

[54] PULSED Y-DECODERS FOR IMPROVING BITLINE PRECHARGING IN MEMORIES

[75] Inventor: Eddy C. Huang, San Jose, Calif.

[73] Assignee: Winbond Electronics Corporation, Hsin-Chu, Taiwan

[21] Appl. No.: 09/025,727

[22] Filed: Feb. 18, 1998

[51] Int. Cl.[7] .................................................. G06F 12/00
[52] U.S. Cl. ......................... 711/1; 365/203; 365/230.03
[58] Field of Search ............................... 711/1; 365/203, 365/230.03, 63

[56] References Cited

U.S. PATENT DOCUMENTS

| | | | |
|---|---|---|---|
| 4,881,203 | 11/1989 | Watanabe et al. | 365/203 |
| 4,972,373 | 11/1990 | Kim et al. | 365/203 |
| 5,193,076 | 3/1993 | Houston | 365/233.5 |
| 5,631,871 | 5/1997 | Park et al. | 365/203 |
| 5,917,744 | 6/1999 | Kirihata et al. | 365/63 |

*Primary Examiner*—Do Hyun Yoo
*Assistant Examiner*—Nasser Moazzami
*Attorney, Agent, or Firm*—Burns, Doanne, Swecker & Mathis, L.L.P.

[57] ABSTRACT

A memory system is accessed and precharged by accessing adjacent columns in the memory array with a pulsed select signal in a first state and then enabling precharge circuitry to precharge the adjacent columns using the same select signal in a second state. Latches, coupled to the outputs of the sense amplifiers sensing the data from the adjacent cells, are also controlled by a pulsed signal synchronized with the select signal such that at the same time the adjacent columns are selected and accessed, the latches detect the data sensed by their corresponding sense amplifier. Once the select signal changes to its second state, the adjacent columns are deselected and the latches are disabled such that the data sensed from the adjacent columns is saved by the latches and provided to the output of the memory system and such that the precharge circuitry is enabled and the adjacent column bitlines are precharged. Access cycle times are reduced by accessing and precharging small sets of adjacent columns such that precharge takes less time and occurs immediately after cells have been accessed.

12 Claims, 7 Drawing Sheets

PULSED Y-DECODERS FOR IMPROVING BITLINE PRECHARGING IN MEMORIES

BACKGROUND OF THE INVENTION

1. Field of the Invention

The present invention relates to memory cell precharging, and more particularly to precharging blocks of memory in a random access memory.

2. State of the Art

Most memories consist of storage cells which produce differential outputs (referred to as bitline true (T) and complement (C) signals). For either read or write operations, differential voltage levels are developed between the T and C bitlines. In some memories (e.g., static random access memories (RAMs)), the T and C bitlines are initially precharged to the same voltage level (often to a logic HIGH voltage level) to prepare for the next access. Once column and row select signals are applied and bitlines are precharged, the bitlines are read such that a differential signal is developed across the once precharged bitlines. In order to perform the next bitline read, the bitlines must first be recharged again. Hence, the amount of time it takes to perform bitline precharging determines part of the memory access cycle time. Specifically, the longer the precharge time, the longer the total memory access cycle time. Consequently it is advantageous to reduce precharge times thereby reducing overall access times.

Figure 1A:
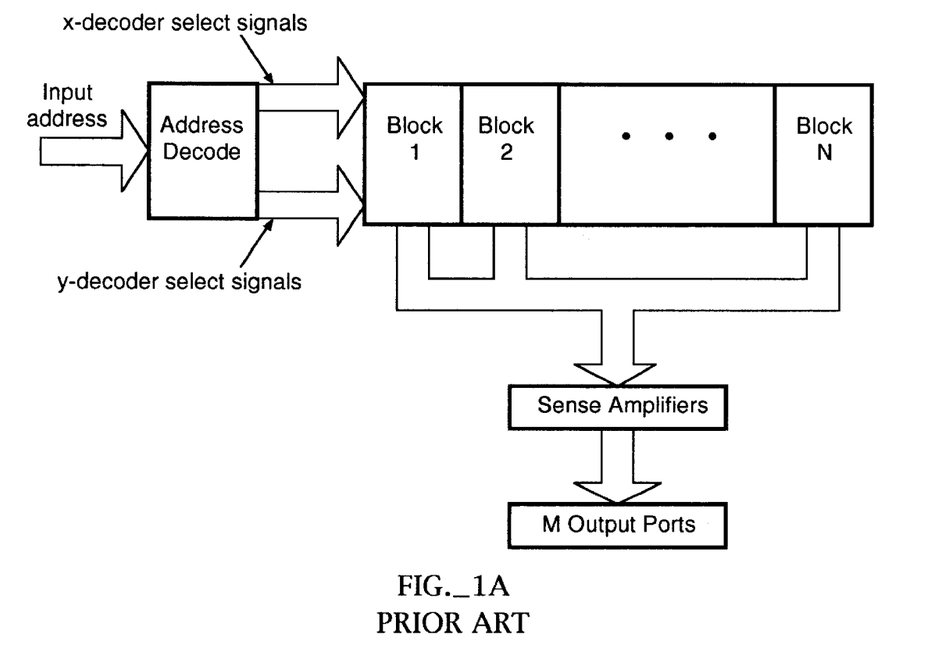
FIG. 1A shows a prior art memory system structure having an array divided into blocks of columns.
Figure 1B:
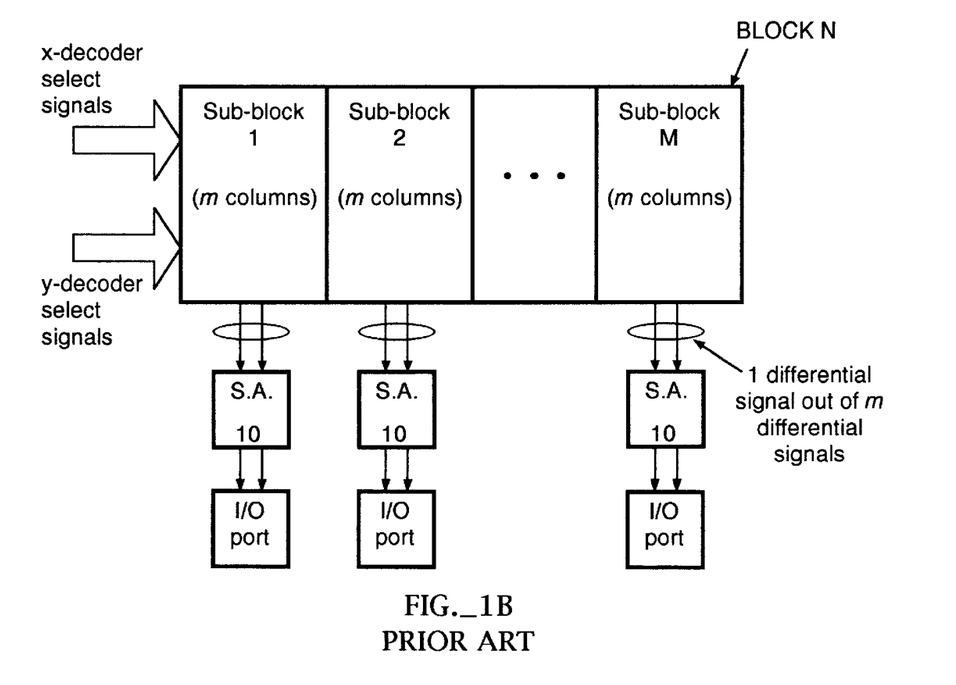
FIG. 1B shows accessing a memory block in the system shown in FIG. 1A.

Large memory arrays are often divided into N blocks of columns of memory cells (FIG. 1A). An input address is decoded and x-decoder select signals and y-decoder select signals are applied to the memory array such that a single block of columns is accessed and sensed by a set of sense amplifiers. The data sensed by the amplifiers is then provided to M output ports. Each of the N blocks of columns is further divided into M (i.e., the number of output ports) sub-blocks of columns having m columns each (FIG. 1B). For instance, a 1M bit (i.e., $1 \times 10^6$ bit) memory arranged in a 1K bits×1K bits array configuration (i.e., 1024 rows and 1024 columns) might be divided into eight blocks (i.e., N=8) of 128 columns each. And, in the case when the 1M bit memory has four outputs (i.e., M=4), each 128 column block is divided into four sub-blocks having 32 columns (i.e., m=32) each.

Each sub-block of columns has a corresponding sense amplifier 10 (FIG. 1B). Hence, for an M output port memory system, each block of columns has M corresponding sense amplifiers. When a given block is accessed by decoded x and y select signals, each sub-block provides one differential signal out of m differential signals from its m columns to its corresponding sensor amplifier. For instance, in the case in which a block of columns divided into 32 column sub-blocks (m=32) is accessed, each sub-block outputs 1 differential signal out of 32 possible signals to its corresponding sense amplifier.

As shown in FIGS. 1A and 1B, the input address is decoded to provide x select signals and y select signals which select the M cells in the array to provide data to the M output ports. In the case of a memory structure such as shown in FIG. 1A, the x and y select signals select one of the N blocks and one column in each sub-block. Column selection is performed using pass or select gate pairs 20–22 (FIG. 1C) coupled in series with each bitline pair (bit and bit/) and having their gates coupled to differential y-select signals y0 and y0/ through ym and ym/.

Figure 1C:
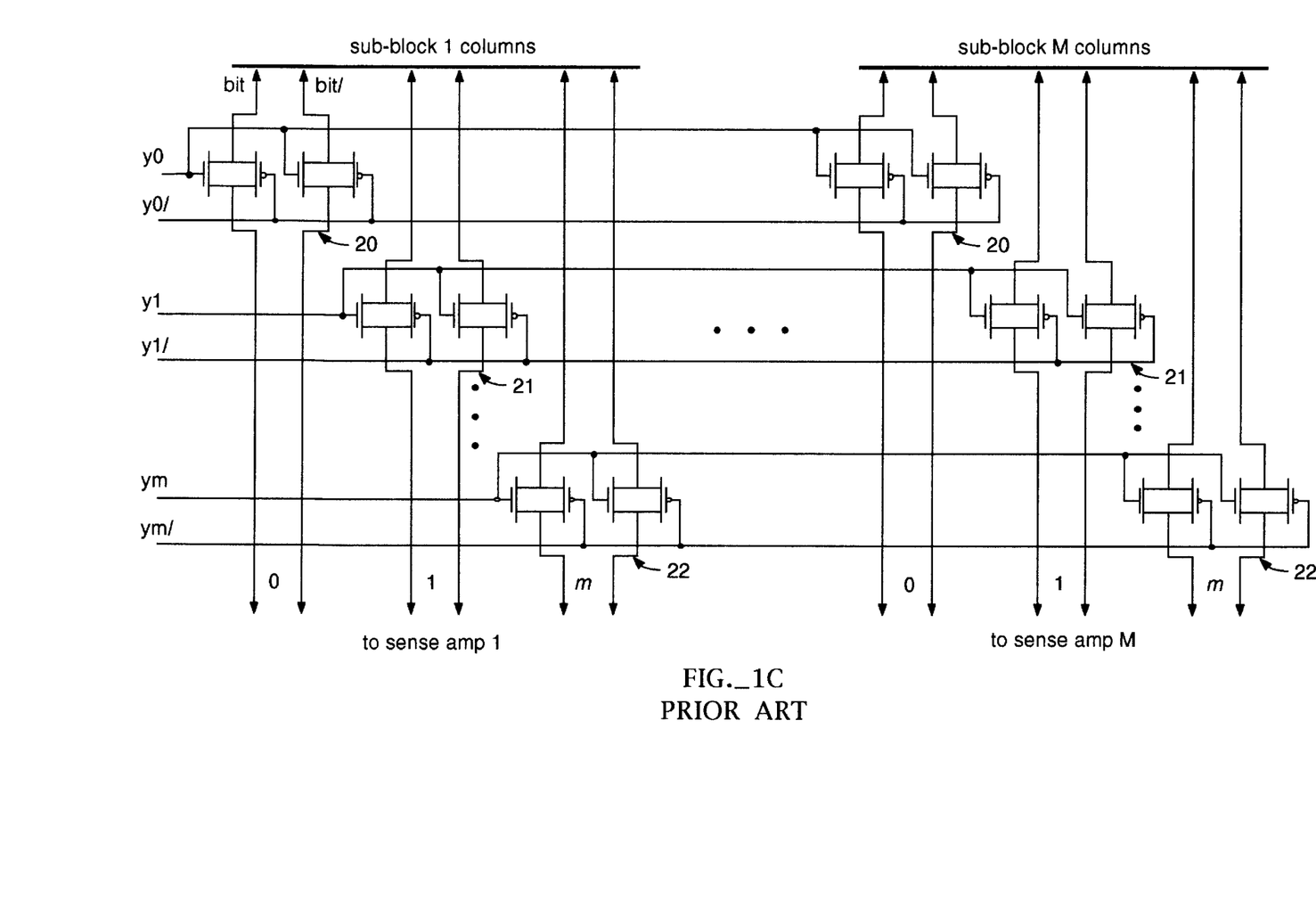
FIG. 1C shows prior art y-select circuitry.

When a pass gate pair is selected, (e.g., y0=1, y0/=0), an electrical path is established from the cell to one of the M sense amplifiers and depending on the x-select signals, data is sensed from a selected cell. The differential y-select signal y0 and y0/ through ym and ym/ are coupled to the sub-blocks 1–M such that nonadjacent bitline pairs provide the data to the output ports. For instance, in the case in which the differential y-select signal y1=1 and y1/=0, then bitline pair 21 in each sub-block provides data from non-adjacent bitline pairs to a set of M sense amplifiers.

Figure 1D:
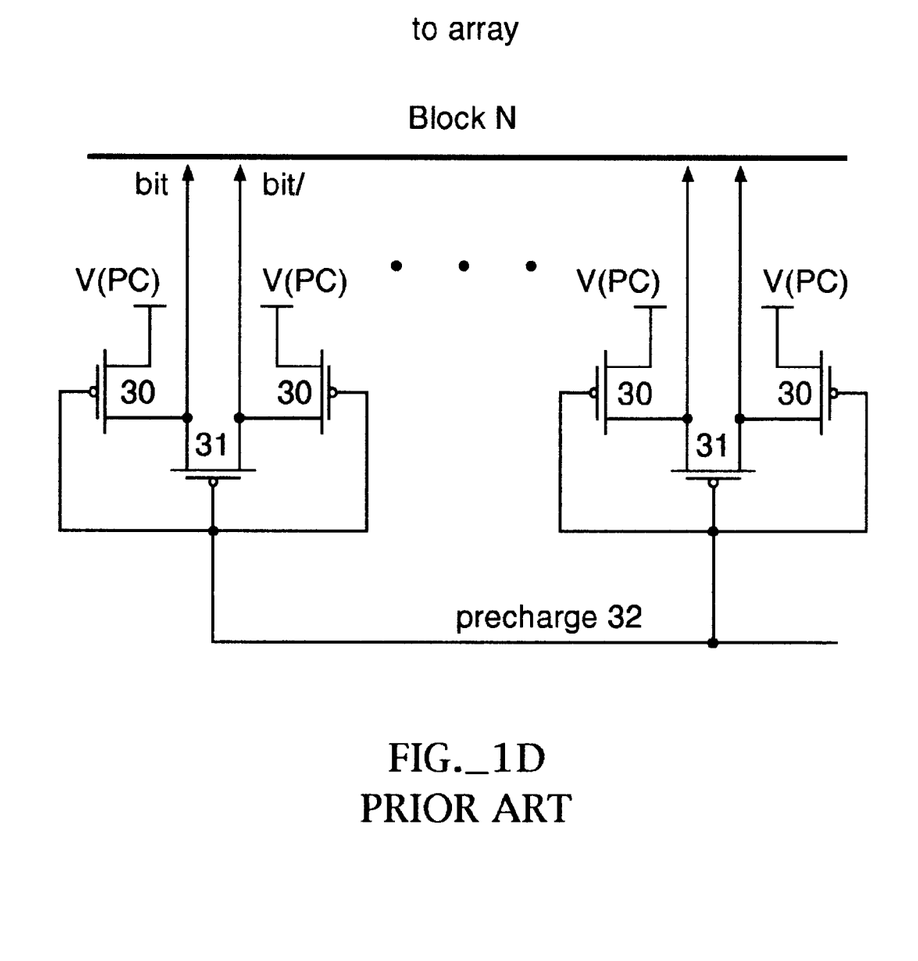
FIG. 1D shows prior art precharge circuitry.

Since each sub-block provides one output signal, it is common practice to precharge all bitlines, in all of the sub-blocks in a given selected block of columns. For instance, all of the columns of block N are charged to prepare for accessing M columns from the block of columns. In the case of a block having 128 columns, all 128 bitline pairs (i.e., true and complement) are charged. Charging circuitry is generally implemented with two PMOS devices 30 and an equalizing device 31 have their gates coupled to a precharge signal 32 (FIG. 1D). When the precharge signal is driven low, devices 30 and 31 are turned on and pull bitline and bitline/ to the pre-charge voltage (Vpc), (note, device 31 equalizes bitline and bitline/). Precharge signal 32 enables devices 30 and 31 in a single block of columns to precharge the block in preparation of accessing it. The precharge signal is either synchronously or asynchronously applied after the read operation has been completed.

The problem with this type of access and precharge memory system technique is that as the number of columns per block increases, the capacitive loading associated with each column for charging the columns also increases. As a result, it takes longer to properly charge all bitlines in a given block thereby resulting in an overall increase in access time due to longer precharge times.

The present invention is a manner in which to minimize the impact of precharging in a memory system by restructuring memory array column accessing and performing precharging on smaller numbers of columns during the access cycle.

SUMMARY OF THE INVENTION

The present invention is a system and method of accessing and precharging a memory system so as to minimized pre-charge times and hence, minimize overall access cycle times. In accordance with the method and system of the present invention, the memory system is accessed by y-select signals which select a set of adjacent columns for providing data to sense amplifiers and output ports. In one embodiment, the number of adjacent columns in a set corresponds to the number of output ports. The set of adjacent columns are accessed using a y select signal in a first state and then are pre-charged using the same select signal in a second state. In particular, the select signal for the adjacent columns, when in a first state, selects the adjacent columns and, when in a second state, the precharge circuitry of the adjacent columns is enabled and the adjacent columns are pre-charged.

In one embodiment, the memory array is divided into sub-blocks of columns each sub-block being made up of a plurality of sets of adjacent columns. When an input address is applied to the x and y decoders, the x-decoder selects a single wordline in the array, while the y-decoder selects a single sub-block and a single set of adjacent columns within the sub-block.

In one preferred embodiment, the select signal is a pulsed select signal generated by a pulsed y-decoder. When a pulsed control signal which is applied to the y-decoder is in a first state, the decoder outputs a set of selection signals which includes a single select pulse signal for selecting the set of adjacent columns. The data from the memory cells in the array which reside at the intersection of the selected wordline (dependent on x-decode signals) and the set of selected adjacent columns is detected by a sense amplifier coupled to each column. The pulse signal is also applied to a set of latches, each of which is coupled to the output of each sense amplifier, such that it latches the data detected by the sense amplifier during the pulse signal. Once the pulse switches to a second non-pulsed state, the y-select signal is no longer present and the set of adjacent columns and the latch is disabled such that it still retains the detected data on its output.

The pulsed signal is also coupled to precharge circuitry such that when the pulsed signal is in its second logic state (i.e., no select signal provided by the y-decoder), the precharge circuit is enabled and the set of adjacent columns are charged.

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

The present invention, in general, is a system and method of accessing and precharging a memory system so as to reduce access cycle times. Typically, in prior art systems that precharge memory cells, the precharging phase of the access operation occurs prior to the accessing phase of an accessing cycle. As a result, the length of the precharging phase impacts the overall accessing cycle times of the memory system. The memory system structure of the present invention is designed to reduce overall accessing cycle time by restructuring memory array accessing such that a smaller number of columns are precharged in each access cycle and by using a pulsed y-select signal to perform both accessing and precharging resulting in overall reduced access cycle times.

Large memory systems are often divided into blocks of columns as shown in FIG. 1A. In general, these memory systems are accessed with an input address that is decoded by an address decoder which generates select signals to select the desired memory cells for providing the data to the sense amplifiers and output ports. Select signals are generated by an x-decoder which provides x-select signals for selecting a single row and by a y-decoder which provides y-select signals for selecting a set of columns. When a memory cell has both its corresponding row and column selected, its data can be sensed by a sense amplifier and passed to the memory system output ports.

Figure 2:
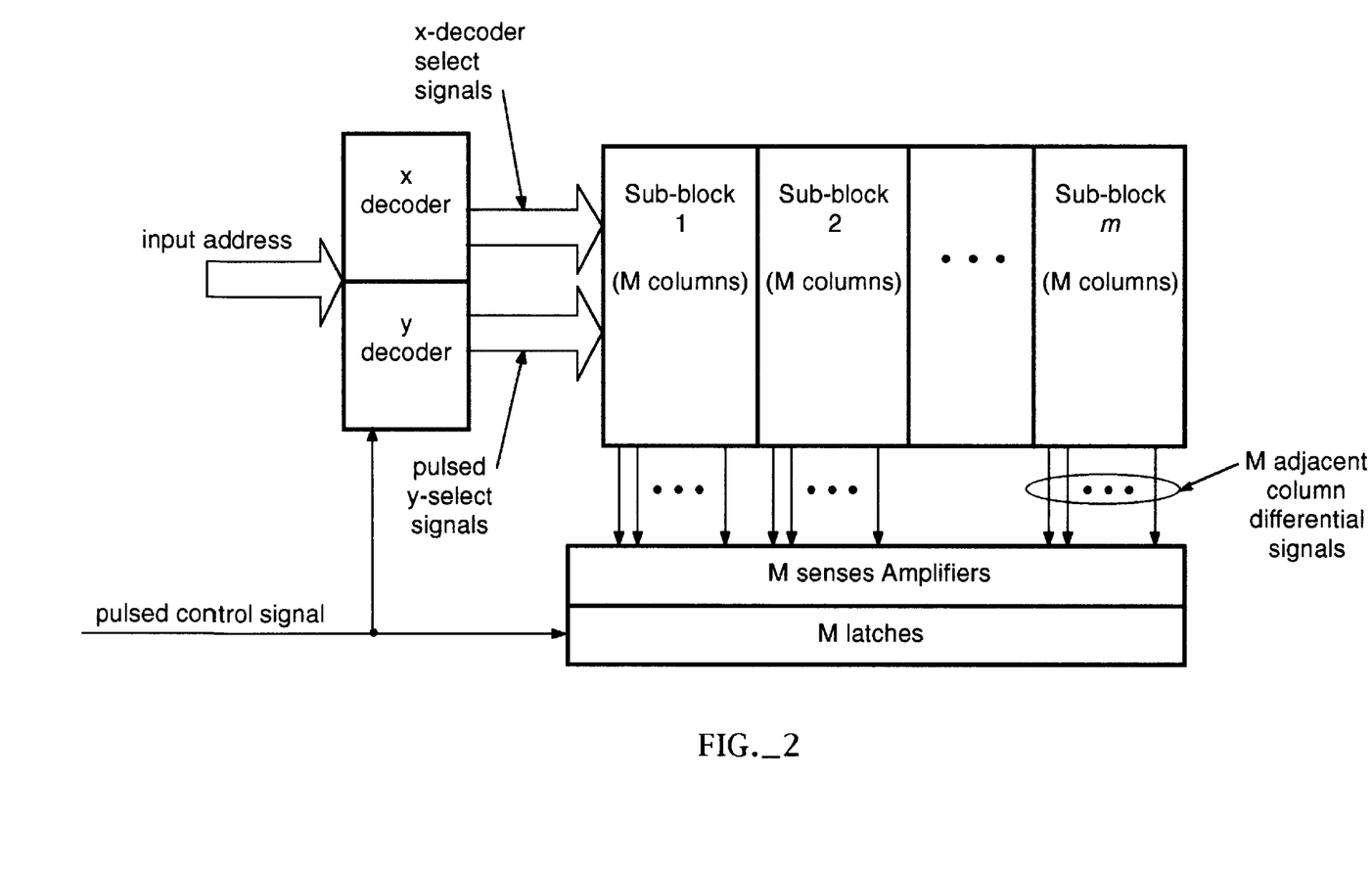
FIG. 2 shows a memory system structure using pulsed select signals in accordance with one embodiment of the present invention.

FIG. 2 illustrates a system for accessing a memory array in accordance with the system and method of the present invention. The memory array is divided into a plurality of sub-blocks 1–m. Each sub-block includes M adjacent columns, each adjacent column being coupled to a different one of M sense amplifiers for sensing its data. Coupled to the output of each of the M sense amplifiers is a latch responsive to a pulsed control signal. The sub-blocks are accessed by the x-decoder select signals and pulsed y-decoder select signals.

Row selection using the x-decoder select signals is well known in the field of memory design and can be implemented in a variety of manners. For instance, in one row selection technique a single row is selected and then accessed using the x-decoder select signals. Another technique of row selection uses a global word line select signal to select a group of word lines and uses a sub-word line select signal to select one wordline from the group of word lines for accessing.

The pulsed y-select signals function to select M adjacent columns in one of sub-blocks 1–m. When the pulsed control signal is in a first logic state (i.e., pulsed state) a set of M adjacent columns are selected and M memory cells are accessed depending on the x-decoder select signals. The data from the M adjacent accessed columns during the pulsed state is detected by each of their corresponding sense amplifier. The pulsed control signal is also coupled to each of the M latches which are coupled to the outputs of the M sense amplifiers such that during the pulsed state, the detected data is passed to the M latches. When the pulsed control signal switches to a second logic state (i.e., non-pulsed state) both of the y-decoder and M latches are disabled such that the M adjacent columns are no longer selected and the latch retains the logic state of the detected data on its output. The latched data is then passed to the output ports (not shown).

In one embodiment of the present invention, a memory array is structured to include a plurality of blocks of columns. For example, the memory array is structured similar to the memory array shown in FIG. 1A in that it includes Blocks 1–N. In accordance with this embodiment of the present invention, each of the blocks of columns is structured to include a plurality of sub-blocks of M adjacent columns. For instance, in the memory system shown in FIG. 2, sub-blocks 1–m would represent a single block of columns and the remaining memory array would be made up of more blocks of columns—each including m sets of M adjacent columns. In this embodiment, a block select signal is also generated from the decoded input address to select a single block of columns.

Figure 3:
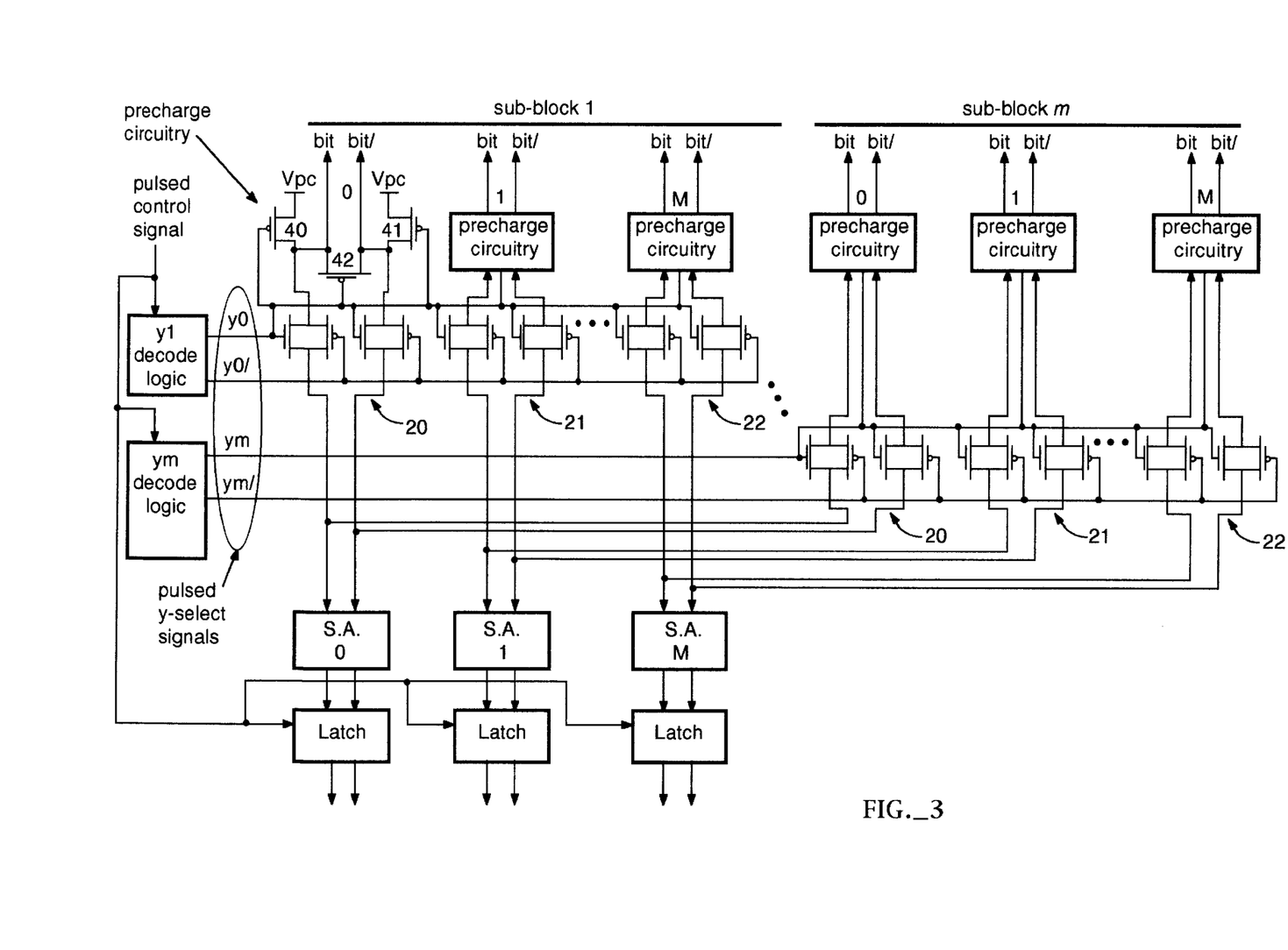
FIG. 3 shows one embodiment of selection circuitry and precharge circuitry for accessing and precharging the memory array structure shown in FIG. 2.

FIG. 3 shows one embodiment of the selection circuitry, accessing circuitry, and precharge circuitry for the memory array structure shown in FIG. 2. The memory array structure shows each of m sub-blocks each including M columns of bitline pairs (i.e., bit and bit/) from 0 to M. Each sub-block has associated y-select decode logic which outputs a select signal and its inverse. For instance, sub-block 0 has y0-select decode logic which provides select signals y0 and y0/ and sub-block m has ym-select decode logic which provides select signal ym and ym/.

Each of the y-select decode logic blocks are coupled to the pulsed control signal and are responsive to the control signal such that when the pulse signal is in a first state (i.e., pulsed state) one of the m select decode logic blocks selects M adjacent columns in one of the m sub-blocks. Each selected adjacent column develops a differential signal across its bit lines indicative of the data stored in the memory cell residing at the intersection of the column and a selected word line. (Note, word line selection is not shown.) The differential signal developed across each of the M adjacent columns is detected by a corresponding one of the sense amplifiers S.A.(0) through S.A.(M). The bit line pairs of the columns in the remaining unselected sub-blocks remain in a charged state.

The pulsed control signal is also coupled to a set of latches which are coupled to the output of sense amplifiers S.A.(0) through S.A.(M). When the pulsed signal is in its first state, the latches are enabled and each latch detects the differential signal sensed by the sense amplifiers.

When the pulsed control signal transitions to its second state (i.e., non-pulsed state) the y-select decode logic and the latches are disabled. When this occurs, the M adjacent columns are no longer selected and the latches are disabled, such that whatever data that was detected on each latches input prior to being disabled (i.e., data sensed from the M adjacent columns) is latched to its output. Hence, the memory cell is accessed when the pulsed control signal is in its pulsed state. The latches then provide the latched data to the output drive circuitry (not shown).

In addition, when the pulsed control signal transitions to its second state, the precharge circuitry is enabled. Specifically, if a set of M adjacent columns are selected in the selection circuitry shown in FIG. 3, the select signal is HIGH and its inverse is LOW. Once the y-select decode logic is disabled, all select signals are LOW and the inverse select signals are HIGH. As a result, the pass gate pairs 20–22 are turned off, but precharge PMOS devices 40–42 are on and pull each of the bit and bit/ lines to precharge voltage, Vpc. It should be noted that PMOS device 42 functions to equalize the charge on the bit and bit/ lines, however, it is not a required element for precharging these lines.

One of the main advantages of accessing and precharging the memory in the manner shown in FIG. 3 is that, by accessing adjacent columns with the same column select signal in a first state and then using the same select signal in a second state as the precharge signal, a much smaller number of columns need to be charged after the columns have been accessed. Specifically, the number of columns to be charged after the memory cells have been accessed corresponds to the number of bits of data sensed from the memory array. In the case of a parallel output memory system, the number of columns to be charged corresponds to the number of output ports. As a result, precharging is quicker, since there is less of a capacitive load (less columns) to charge. In addition, since the precharge signal and the select signal is the same signal, precharging begins immediately after the columns have been selected and accessed and as a result, bitlines are precharged and ready to be selected and accessed at the beginning of the accessing cycle. In contrast, prior art techniques precharge at the beginning of the access cycle and also precharge large numbers of columns (e.g., blocks of columns). As a result, the beginning of the accessing portion of the access cycle can be delayed due to precharging and hence increases total access cycle times.

Figure 4:
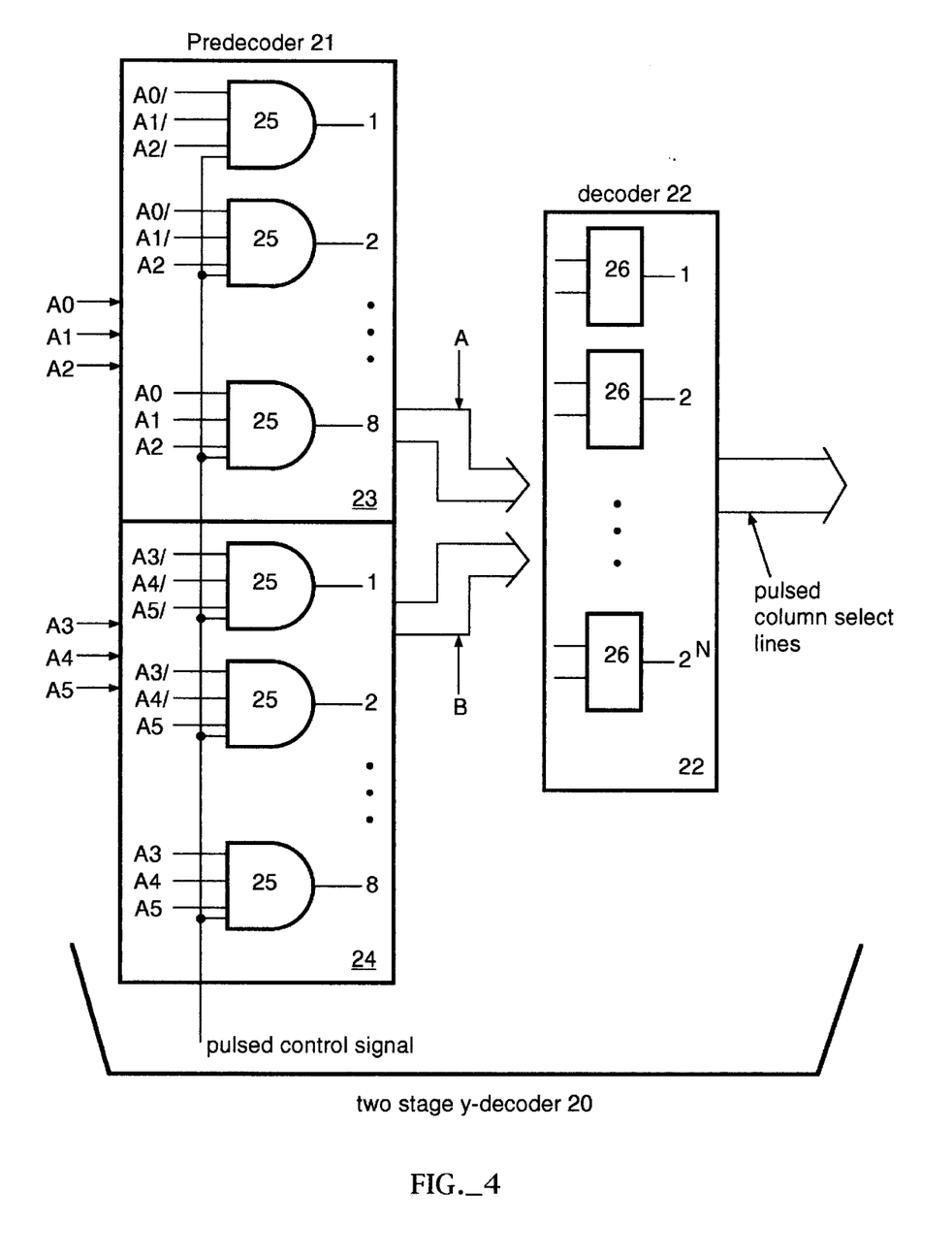
FIG. 4 shows one embodiment of a pulsed y-decoder.

FIG. 4 shows one example of a two stage column select decoder controlled by a pulsed control signal as described in FIG. 3. The decoder includes a predecoder stage 21 and a decoder stage 22. In this example, predecoder 21 includes two portions, a top portion 23 and a bottom portion 24 each accessed by half of column input address bits $A_0$–$A_5$. In this example, the number of address bits N is equal to 6, so that each portion is accessed by 3 bits such that portion 23 is accessed by the low order 3 bits ($A_0$, $A_1$, $A_2$) and portion 24 is accessed by the high order 3 bits ($A_3$, $A_4$, $A_5$). Each predecoder portion 23 and 24 includes AND gates 25 having three inputs each. Predecoder stage 21 outputs two sets of selection signals such that only one selection signal line is selected from each of two sets. the two sets of signals are coupled to decoder stage 22 which includes logic gates 26 having two inputs each. The selection signals are applied such that one input of each logic gate is coupled to a signal from portion 23 and the other input is coupled to a signal from portion 24. Decoder 22 outputs the column select signals—each corresponding to one of the m sub-blocks. To access a set of adjacent columns, when the pulsed control signal is in its pulsed state=HIGH, each of AND gates 25 are allowed to output a logic signal corresponding to the input addresses coupled to their inputs and predecoder 21 outputs two sets of selection signals, two of which are select signals from each of portions 23 and 24. The two select signals selects one of logic gates 26 which, in turn, outputs a select signal corresponding to one of the sub-blocks. When the pulsed control signal is in its non-pulsed state=LOW, then each of the AND gates 25 are forced to output a LOW logic level regardless of the input address signal. As a result, no select signals are provided to decoder 22 and the pulsed column select lines also do not provide any select signals. It should be noted that although FIG. 4 shows a decoder having single-ended inputs and outputs, it is well understood in the field of circuit design, the manner in which to implement the decoder to provide differential output signals.

Figure 5:
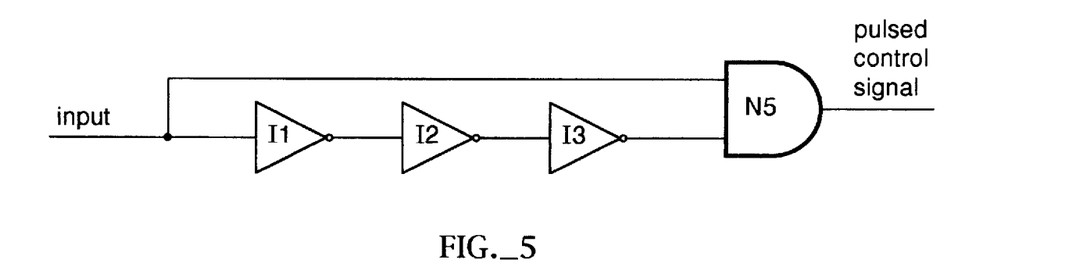
FIG. 5 shows one embodiment of one-shot pulsed signal generation circuit.

FIG. 5 shows one example of how to implement a one shot clock pulse generation circuit. As shown, an input signal is coupled to the input of a set of inverters including an odd number of series coupled inverters I1, I2, I3. The output of inverter I3 is coupled to one input of AND gate N5 and the other input of AND gate N5 is coupled to the input signal. The input signal can be initiated from a clock edge for synchronous memory devices or from address transition detection (ATD) for asynchronous memory devices. The number of inverters in the string determines the width of the one shot pulse and hence, the length of time the memory cell is selected and the sense amplifier is sensing data from the cell.

In the preceding description, numerous specific details are set forth, such as specific logic gates and switching device types, and address decode circuitry in order to provide a thorough understanding of the present invention. It will be apparent, however, to one skilled in the art that these specific details need not be employed to practice the present invention. In other instances, well known memory system structures have not been described in order to avoid unnecessarily obscuring the present invention.

Moreover, although the components of the present invention have been described in conjunction with a certain embodiment, it is appreciated that the invention can be implemented in a variety of other ways. Consequently, it is to be understood that the particular embodiments shown and described by way of illustration is in no way intended to be considered limiting. Reference to the details of this embodiment is not intended to limit the scope of the claims which themselves recite only those features regarded as essential to the invention.

What is claimed is:

1. A memory system having memory system output ports comprising:
   an array of column and rows of memory cells for storing digital data, said array being arranged into groups of M adjacent columns of cells, each column having an associated bitline and complementary bitline;
   a plurality of column decoders, each being associated with one group of M adjacent columns, wherein in response to an input address signal said one group of M adjacent columns is accessed with a select signal by its associated column decoder when said select signal is in a first logic state during an access cycle, and wherein the remainder of said groups of M adjacent columns in said array are not selected;
   a plurality of sense amplifiers for sensing said stored digital data from said one group of M adjacent columns when said select signal is in said first logic state, said stored digital data having an associated logic state;
   a plurality of charging means each coupled to and for charging said associated bitline and complementary bitline of said each column in said one group of M adjacent columns in response to said select signal being in a second logic state during said access cycle such that only said associated bitline and bitline complement of said each column in said one group of M adjacent columns are charged during said access operation; and
   means for outputting said sensed data from said output ports.

2. The memory system as described in claim 1 further comprising a plurality of latches for detecting said logic state of said sensed digital data in response to a control signal when said select signal is in said first state and for latching to its output said logic state of said sensed digital data when said select signal is in said second state.

3. The memory system as described in claim 2 wherein said control signal is a pulsed control signal and said select signal is pulsed into said first logic state in response to said pulsed control signal.

4. The memory system as described in claim 1 wherein said one group of M adjacent columns includes the same number of columns as the number of said memory system output ports.

5. The memory system as described in claim 3 wherein said plurality of column decoders are each responsive to said pulsed control signal wherein when said pulsed control signal is in said first state, one of said plurality of column decoders outputs said select signal and when said pulsed control signal is in said second state none of said plurality of column decoders outputs said select signal.

6. The memory system as described in claim 3 wherein said plurality of charging means each comprise switching devices coupled to one column's bitline and complementary bitline, wherein when said select signal is in said second state, said charging means is enabled and drives said column's associated bitline and complementary bitline to a precharge voltage.

7. A method for accessing and precharging a memory system including an array of rows and columns of memory cells, said array being arranged into groups of M adjacent columns of cells, each column of said memory cells having an associated bitline and complementary bitline, said memory system including a set of output ports, said method comprising the steps of:
   accessing, in response to an input address signal, one of said groups of M adjacent columns with a select signal in a first logic state during an access cycle;
   sensing said stored digital data from said one group of M adjacent columns when said select signal is in said first logic state, said stored digital data having an associated logic state, wherein the remainder of said groups of M adjacent columns in said array are not selected; and
   charging said associated bitline and bitline complement of each column of said one group of M adjacent columns in response to said select signal being in a second logic state during said access cycle such that only said associated bitline and bitline complement of said each column are charged during said access cycle.

8. The method as described in claim 7 further comprising the step of detecting said sensed logic state of said stored digital data when said select signal is in said first logic state and latching said sensed logic state when said select signal is in said second logic state.

9. The method as described in claim 8 further comprising the step of pulsing said select signal into said first state.

10. The method as described in claim 7 further comprising the step of accessing only one of a plurality of blocks of columns during said access cycle, wherein said one block including said one group of M adjacent columns.

11. The method as described in claim 7 wherein said step of accessing comprises accessing the same number of adjacent columns as there are output ports.

12. A memory system having memory system output ports comprising:
   an array of rows and columns of memory cells for storing digital data, said array of memory cells being arranged into N blocks of columns of cells, each block of columns including m sub-blocks of columns, each sub-block including M adjacent columns of cells, each column of said memory cells having an associated bitline and complementary bitline;
   a block selector responsive to an input address signal for selecting one of said N blocks;
   a plurality of m column decoders, each for selecting and accessing one sub-block of M adjacent columns within a selected one of said N blocks, wherein in response to said input address signal, said one of said N blocks is selected and said one sub-block of M adjacent columns is selected and accessed with a select signal by its associated column decoder when said select signal is in a first logic state during an access cycle, and wherein the remainder of said sub-blocks in said one selected block in said array are not selected;
   a plurality of sense amplifiers for sensing said stored digital data from said one sub-block of M adjacent columns when said select signal is in said first logic state, said stored digital data having an associated logic state;
   a plurality of charging means each coupled to and for charging said associated bitline and complementary bitline of said each column in said one sub-block of M adjacent columns in response to said select signal being in a second logic state during said access cycle such that only said associated bitline and bitline complement of said each column in said one group of adjacent columns are charged during said access operation; and
   means for outputting said sensed data from said output ports.

* * * * *